(12) United States Patent
Shyu

(10) Patent No.: US 8,866,203 B2
(45) Date of Patent: Oct. 21, 2014

(54) METHOD FOR FORMING COMPOUND EPITAXIAL LAYER BY CHEMICAL BONDING AND EPITAXY PRODUCT MADE BY THE SAME METHOD

(75) Inventor: Kuo-Wei Shyu, Hsinchu (TW)

(73) Assignee: Huey-Jean Lin, Hsinchu (TW)

( * ) Notice: Subject to any disclaimer, the term of this patent is extended or adjusted under 35 U.S.C. 154(b) by 5 days.

(21) Appl. No.: 13/542,074

(22) Filed: Jul. 5, 2012

(65) Prior Publication Data
US 2014/0008771 A1    Jan. 9, 2014

(51) Int. Cl.
*H01L 31/0232* (2014.01)

(52) U.S. Cl.
USPC ................ 257/288; 257/255; 257/E29.255

(58) Field of Classification Search
USPC ............... 257/288, E21.19, E29.255; 427/255.391, 255.32, 255.36, 255.7, 427/402, 419.3
See application file for complete search history.

(56) References Cited

U.S. PATENT DOCUMENTS

| | | | |
|---|---|---|---|
| 6,319,765 B1 * | 11/2001 | Cho et al. | 438/240 |
| 8,221,838 B2 * | 7/2012 | Gates et al. | 427/255.391 |
| 2004/0092096 A1 * | 5/2004 | Raaijmakers et al. | 438/627 |
| 2012/0146113 A1 * | 6/2012 | Suzuki et al. | 257/288 |
| 2012/0287094 A1 * | 11/2012 | Mizuki et al. | 345/204 |

* cited by examiner

*Primary Examiner* — Michael Shingleton
(74) *Attorney, Agent, or Firm* — Bacon & Thomas, PLLC

(57) ABSTRACT

The present invention is to provide a method for forming a compound epitaxial layer by chemical bonding, which comprises the steps of forming a contact layer on a substrate; chemically reacting atoms on a surface of the contact layer with non-metal atoms, such that the non-metal atoms form non-metal ions for chemically bonding to the atoms on the surface of the contact layer; exciting the non-metal ions by energy excitation, such that unpaired electrons of the non-metal ions not yet bound to the atoms on the surface of the contact layer become dangling bonds; and conducting chemical vapor deposition by introducing an organic metal compound and a reactant gas, wherein metal ions of the organic metal compound are bound to the dangling bonds by electric dipole attraction, and anions of the reactant gas are bound to the metal ions by ionic bonding, such that the compound epitaxial layer is formed.

11 Claims, 5 Drawing Sheets

METHOD FOR FORMING COMPOUND EPITAXIAL LAYER BY CHEMICAL BONDING AND EPITAXY PRODUCT MADE BY THE SAME METHOD

FIELD OF THE INVENTION

The present invention relates to a method for forming a compound epitaxial layer, more particularly to a method for forming a compound epitaxial layer by chemical bonding, wherein the compound epitaxial layer has chemical bonds with an unsaturated ionic bond layer and a contact layer, and the chemical bonds are much stronger than physical binding achieved by the prior art, so as to effectively prevent the different layers from delamination.

BACKGROUND OF THE INVENTION

Epitaxy is a technique for use in the manufacture of semiconductor devices. Also known as epitaxial growth, this technique is intended for growing crystals on a substrate and thereby producing a new semiconductor layer. Crystals or crystal grains grown by epitaxy are called epitaxial crystals. Epitaxy can be used to make silicon transistors, complementary metal-oxide-semiconductor (CMOS) integrated circuits and so on. In particular, epitaxy is an essential technique for making compound semiconductors.

Epitaxy includes chemical vapor deposition (CVD), molecular beam epitaxy (MBE), vacuum evaporation, liquid-phase epitaxy (LPE) and solid-phase epitaxy (SPE). In a semiconductor manufacturing process, one basic and important step is to grow an epitaxial layer on a semiconductor substrate, and the thickness and composition of the epitaxial layer have a significant impact on the features and yield rate of the product. Among the various epitaxy methods, perhaps only MBE can fully satisfy precision requirements; therefore, MBE is typically used in making epitaxy products having mirror-like planar crystals. Invented by J. R. Arthur and Alfred Y. Cho at Bell Laboratories, MBE is a method for growing single-crystal materials and must be performed in high vacuum or ultra-high vacuum.

The most important feature of MBE is its low deposition rate. In most cases, MBE allows films to grow epitaxially at a rate less than 1000 nm per hour. The low deposition rate, however, also means that a sufficiently high vacuum is required to achieve the same purity level as other deposition methods. In solid-source MBE, elements are separately heated in an ultra-pure form until they begin to sublime slowly. The resultant gaseous substances condense on a wafer and react with one another. Gallium and arsenic, for example, can react with each other to form single-crystal gallium arsenide. The word "beam" is used in the term "molecular beam epitaxy" because the gas atoms in the MBE process do not interact with one another or with substances in the vacuum chamber. During the MBE process, the progress of crystal layer growth can be monitored by reflection high-energy electron diffraction (RHEED). In addition, the growth of each crystal layer—even each single layer of atoms—can be precisely controlled by controlling the valves of the reaction chamber. As the rate of epitaxial growth depends entirely on the number of molecules impinging on the substrate surface in a unit time, the thickness of each epitaxial layer formed by MBE can be precisely controlled thanks to its low deposition rate.

A product with mirror-like planar crystals grown by MBE is free of island-type nucleation or cluster growth, both of which are characteristics of columnar crystals. Nevertheless, an MBE product tends to have relatively low binding strength between the epitaxial layers, which are bound together by physical contact. According to years of research and observation by the inventor of the present invention, a product made by the conventional MBE method is subject to delamination of the epitaxial layers, which is highly undesirable. Further, MBE often suffers from high epitaxial barriers and incurs high production costs that lay a huge burden on the manufacturers.

In view of the prior art, a group III-V nitride (e.g., AlGaInN) substrate structure with an epitaxial buffer layer made of titanium nitride has been disclosed, wherein the titanium nitride buffer layer is formed on the surface of a silicon substrate. Using a silicon substrate for the epitaxy of a group III-V nitride layer has the following advantages: (1) the manufacturing process can be simplified, and the associated costs can be reduced; (2) good thermal conductivity is provided; (3) a large surface area (so far 12" or greater in diameter) is achievable; and (4) the existing silicon-based semiconductor techniques can be used. However, as the lattice constant at the (111) surface of silicon is far different from that at the (0001) surface of the group III-V nitride (e.g., AlGaInN), the significant mismatch between the lattices requires that a buffer layer be grown on the silicon before the desired nitride film is formed, wherein the buffer layer serves to overcome the stress caused by lattice mismatch. While making direct use of metalorganic chemical vapor deposition (MOCVD) to grow a titanium nitride film, the inventor of the present invention has found after thorough study that it is practically difficult to produce effective crystal grains by using the approach disclosed in the prior art. Hence, the method disclosed in the prior art is currently inapplicable to actual production.

There was another method for making a semiconductor device, and the product of the another method mainly includes a substrate, a titanium layer, a metal nitride layer and a group III nitride semiconductor layer. The titanium layer is formed on the substrate. The metal nitride layer is made of a metal nitride containing one or more metals selected from the group consisting of titanium, zirconium, hafnium and tantalum. The group III nitride semiconductor layer is formed on the metal nitride layer. In the another method, a titanium nitride layer (i.e., the metal nitride layer) is formed on the titanium layer by physical vapor deposition (PVD). However, the inventor of the present invention has found after extensive research that the surface crystal grains formed by PVD are too small to form an effective titanium nitride layer and that the yield rate of the product, therefore, has yet to meet industrial requirements.

The issue to be addressed by the present invention is to solve the various problems of the conventional epitaxy methods, thereby increasing the strength of the conventional physical contact-based binding between epitaxial layers, preventing the epitaxial layers from delamination, and allowing mirror-like planar crystals to be formed without using the expensive MBE manufacturing process.

BRIEF SUMMARY OF THE INVENTION

In view of the various problems of the conventional epitaxy methods, the inventor of the present invention conducted extensive research and experiment and finally succeeded in developing a method for forming a compound epitaxial layer by chemical bonding and an epitaxy product made by the method. It is hoped that, under the premise of not using the expensive MBE manufacturing process, epitaxy can be carried out by means of chemical bonding to ensure sufficient binding strength between epitaxial layers and thereby increase product yield.

It is an object of the present invention to provide a method for forming a compound epitaxial layer by chemical bonding, and the method is performed as follows. To begin with, a contact layer is formed on a substrate. The atoms on the surface of the contact layer are then chemically reacted with non-metal atoms at a temperature of 200° C. or above, such that the non-metal atoms form non-metal ions. The non-metal ions are bound to the atoms on the surface of the contact layer by chemical bonding and thus form an unsaturated ionic bond layer on the surface of the contact layer. The non-metal ions are subsequently excited by energy excitation, thereby turning the unpaired electrons of the non-metal ions that have not been bound to the atoms on the surface of the contact layer into dangling bonds. Following that, chemical vapor deposition is performed by introducing an organic metal compound and a reactant gas. The metal ions of the organic metal compound are guided in the directions of the electric dipoles of the dangling bonds and are uniformly bound to the dangling bonds, The anions of the reactant gas, on the other hand, are bound to the metal ions by ionic bonding. Thus, a compound epitaxial layer is formed. As a result of the technical features of the present invention, and thanks to the strong polarity of the dangling bonds and the specific directions of electric dipole attraction, not only are epitaxial barriers lowered, but also the metal ions of the organic metal compound are guided in the correct directions to be uniformly and securely bound to the dangling bonds. Because of that, the compound epitaxial layer formed according to the present invention has high hardness as well as outstanding spectral absorption features. Also, the chemical bonds between the compound epitaxial layer, the unsaturated ionic bond layer and the contact layer are much stronger than the binding conventionally achieved by physical contact, and this high bond strength effectively prevents the different layers from delamination. Further, as the electric dipole attraction of the dangling bonds helps guide and arrange the metal ions and the anions in the correct directions during the formation of the compound epitaxial layer, mirror-like planar crystals free of the structural characteristics of columnar crystals such as island-type nucleation and cluster growth can be formed. Hence, by applying the present invention, a manufacturer can produce mirror-like planar crystals without using the expensive MBE manufacturing process, and product yield can be greatly increased while production costs are reduced.

Another object of the present invention is to provide an epitaxy product having a compound epitaxial layer formed by chemical bonding. The epitaxy product includes a substrate, a contact layer and a compound epitaxial layer, The contact layer is formed on the substrate. The atoms on the surface of the contact layer are chemically reacted with non-metal atoms such that the non-metal atoms form non-metal ions. The non-metal ions are bound to the atoms on the surface of the contact layer by chemical bonding and thus form an unsaturated ionic bond layer. The non-metal ions are then subjected to energy excitation; as a result, the unpaired electrons of the non-metal ions that have not been bound to the atoms on the surface of the contact layer become dangling bonds. To form the compound epitaxial layer, chemical vapor deposition is performed by further introducing an organic metal compound and a reactant gas. The metal ions of the organic metal compound are guided in the directions of the electric dipoles of the dangling bonds and are bound to the dangling bonds. The anions of the reactant gas, on the other hand, are bound to the metal ions by ionic bonding. Thus, the compound epitaxial layer is formed on the contact layer. As the compound epitaxial layer, the unsaturated ionic bond layer and the contact layer are bound together by chemical bonding, which features high binding strength, the epitaxy product of the present invention is apparently superior to those made by the conventional methods.

Still another object of the present invention is to provide the foregoing method and epitaxy product, wherein the substrate is a silicon wafer while the contact layer is a metal layer made of titanium, tantalum, aluminum, zinc, scandium, zirconium or magnesium or is an amphoteric-element layer made of boron or silicon.

Still another object of the present invention is to provide the foregoing method and epitaxy product, wherein the reactant gas can be ammonia ($NH_3$), phosphine ($PH_3$), water ($H_2O$), hydrogen sulfide ($H_2S$) or arsine ($AsH_3$) in order to produce a compound epitaxial layer containing the element nitrogen, phosphorus, oxygen, sulfur or arsenic.

Still another object of the present invention is to provide the foregoing method and epitaxy product, wherein the non-metal atoms reacting chemically with the atoms on the surface of the contact layer are nitrogen, phosphorus, oxygen or sulfur atoms.

Yet another object of the present invention is to provide the foregoing method and epitaxy product, wherein the organic metal compound is tetrakis(dimethylamido)titanium.

BRIEF DESCRIPTION OF THE SEVERAL VIEWS OF THE DRAWINGS

The structure as well as a preferred mode of use, further objects and advantages of the present invention will be best understood by referring to the following detailed description of some illustrative embodiments in conjunction with the accompanying drawings, in which.

DETAILED DESCRIPTION OF THE INVENTION

The inventor of the present invention has long been engaged in research, development and designing in epitaxy-related fields. In the process, the inventor has found that so far mirror-like planar crystals cannot be made epitaxially without using MBE. However, not only is MBE costly, but also the epitaxial layers formed by MBE are bound together by physical contact, whose binding strength is low; as a result, delamination may occur, and low product yield follows, which is highly undesirable. Although attempts have been made in search for improvement, an ideal solution has yet to be found. In consideration of this, the inventor came up with taking advantage of the properties of dangling bonds and using an unsaturated ionic bond layer to realize chemical bonding between a contact layer and a compound epitaxial layer. Thus, by increasing the binding strength between the layers, delamination can be effectively prevented.

Figure 1:
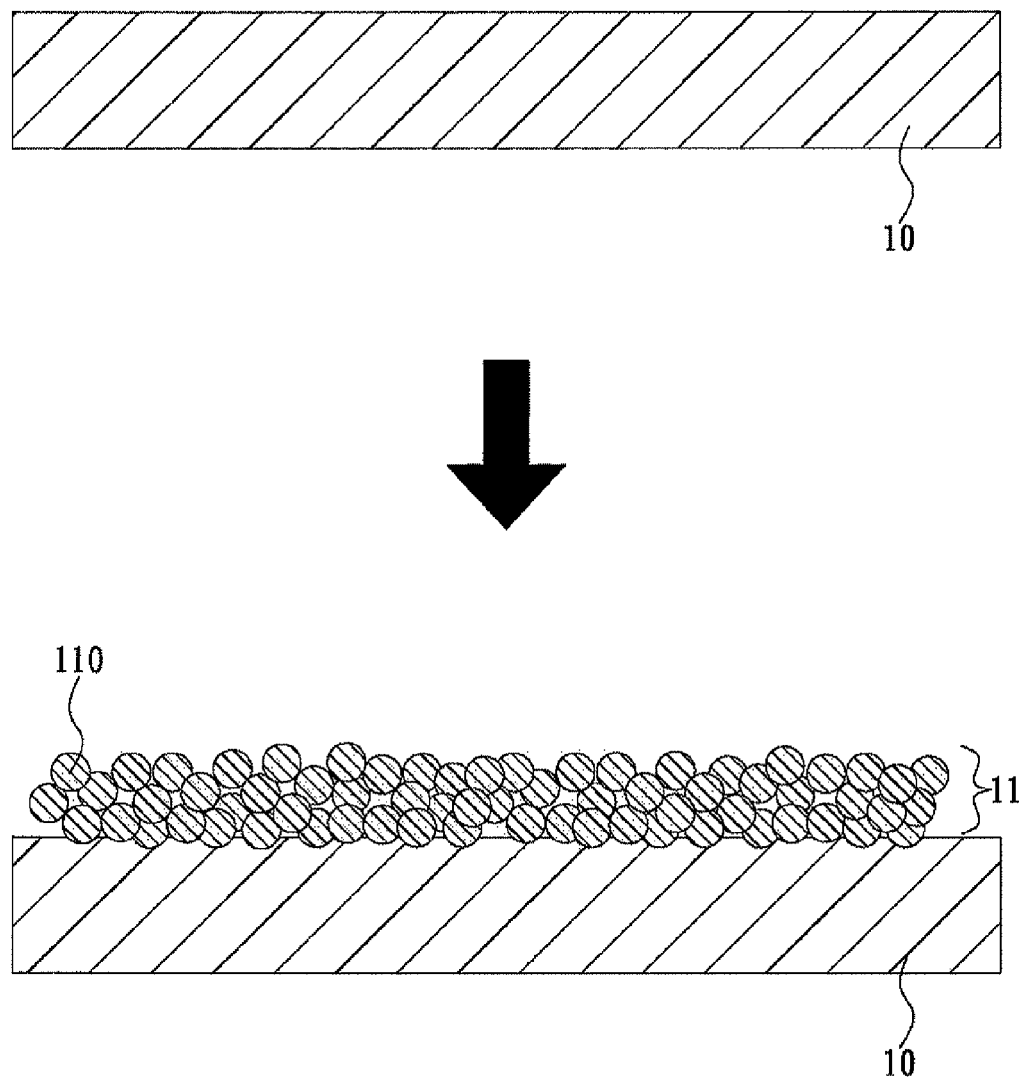
FIG. 1 is the first schematic drawing of a preferred embodiment of the present invention.

The present invention discloses a method for forming a compound epitaxial layer by chemical bonding and an epitaxy product made by the method. To describe the method and the epitaxy product in detail, a preferred embodiment of the present invention is presented as follows. Referring to FIG. 1, the method begins by forming a contact layer 11 on a substrate 10. In this preferred embodiment, the substrate 10 is a silicon wafer, and yet the material of the substrate 10 is not limited to silicon. The substrate 10 may also be made of fused quartz, copper-molybdenum alloy, tungsten, titanium or like materials capable of standing the temperature of the manufacturing process. The contact layer 11, on the other hand, can be a metal layer made of titanium, tantalum, aluminum, zinc, scandium, zirconium or magnesium, or an amphoteric-element layer made of boron or silicon. In this preferred embodiment, the contact layer 11 is formed of titanium, and the titanium is in ohmic contact with the silicon wafer. The term "ohmic contact" refers to the contact between a metal and a semiconductor, wherein the resistance at the contact surface is far lower than the resistance of the semiconductor such that the voltage drop during operation typically takes place in an active region rather than at the contact surface. It should be understood that the materials of the substrate 10 and of the contact layer 11 are not limited to those disclosed herein. All variations easily conceivable by a person skilled in the art should fall within the scope of the present invention.

Figure 2:
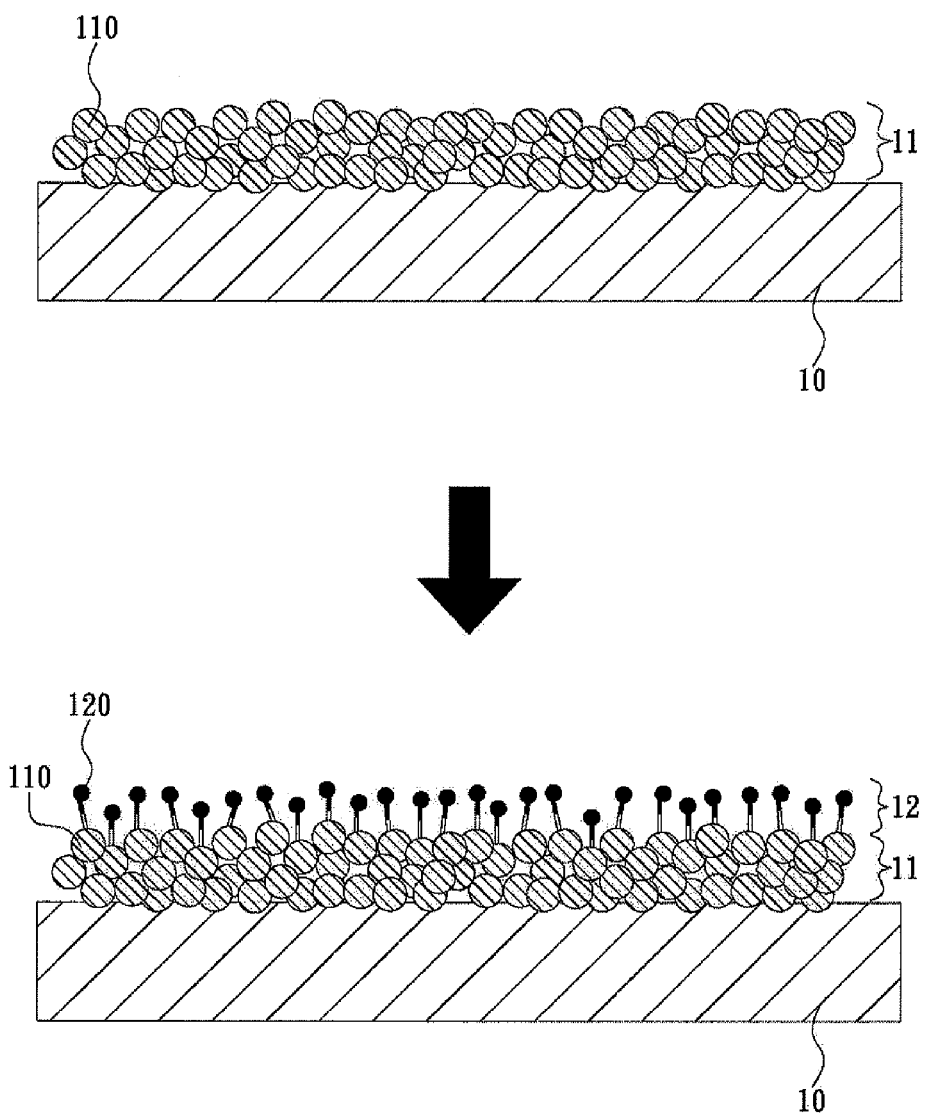
FIG. 2 is the second schematic drawing of the preferred embodiment of the present invention.

After the formation of the contact layer 11, referring to FIG. 2, the atoms (i.e., titanium atoms 110) on the surface of the contact layer 11 are chemically reacted with non-metal atoms at a temperature of, as in this preferred embodiment, 200° C. or above. Consequently, the non-metal atoms form non-metal ions 120, which are bound to the atoms on the surface of the contact layer 11 by chemical bonding. As such, the non-metal ions 120 form an unsaturated ionic bond layer 12 on the surface of the contact layer 11. The non-metal atoms can be atoms of nitrogen, phosphorus, oxygen or sulfur and are nitrogen atoms in this preferred embodiment. After chemical reaction with the atoms (i.e., titanium atoms 110) on the surface of the contact layer 11, the nitrogen atoms become nitrogen ions (i.e., non-metal ions 120) and form the unsaturated ionic bond layer 12.

Figure 3:
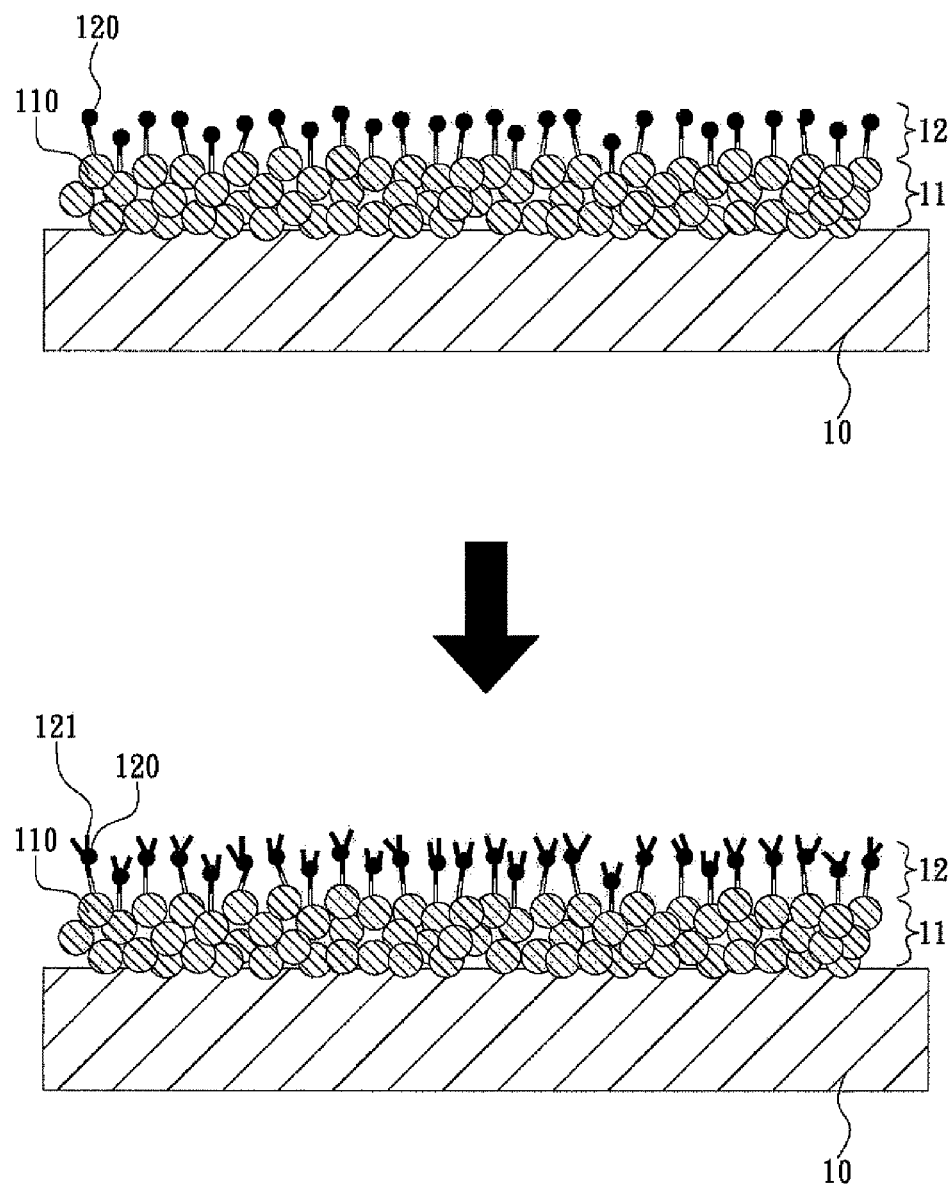
FIG. 3 is the third schematic drawing of the preferred embodiment of the present invention.

In the present invention, referring to FIG. 3, the non-metal ions 120 are excited by energy excitation such that the unpaired electrons of the non-metal ions 120 that have not been bound to the atoms on the surface of the contact layer 11 become dangling bonds 121. A "dangling bond" refers to a free radical consisting of an electron that is not part of a chemical bond (i.e., an unpaired electron). In the present invention, the dangling bonds 121 generated by energy excitation exhibit extremely high activity and have electric dipole attraction. The inventor has found that, once the dangling bonds 121 are generated by excitation, epitaxial barriers are effectively lowered, and this is helpful in forming the subsequent epitaxial layer. In practice, laser can be used as the means of energy excitation, and the present invention imposes no limitations on the excitation means. When performing an epitaxial manufacturing process based on the technical features of the present invention, a manufacturer may change the means of energy excitation according to product requirements and process conditions. For instance, thermal excitation or excitation by other means is equally applicable. All changes conceivable by a person skilled in the art should be viewed as equivalent variations of the present invention and as not departing from the scope of the present invention.

Figure 4:
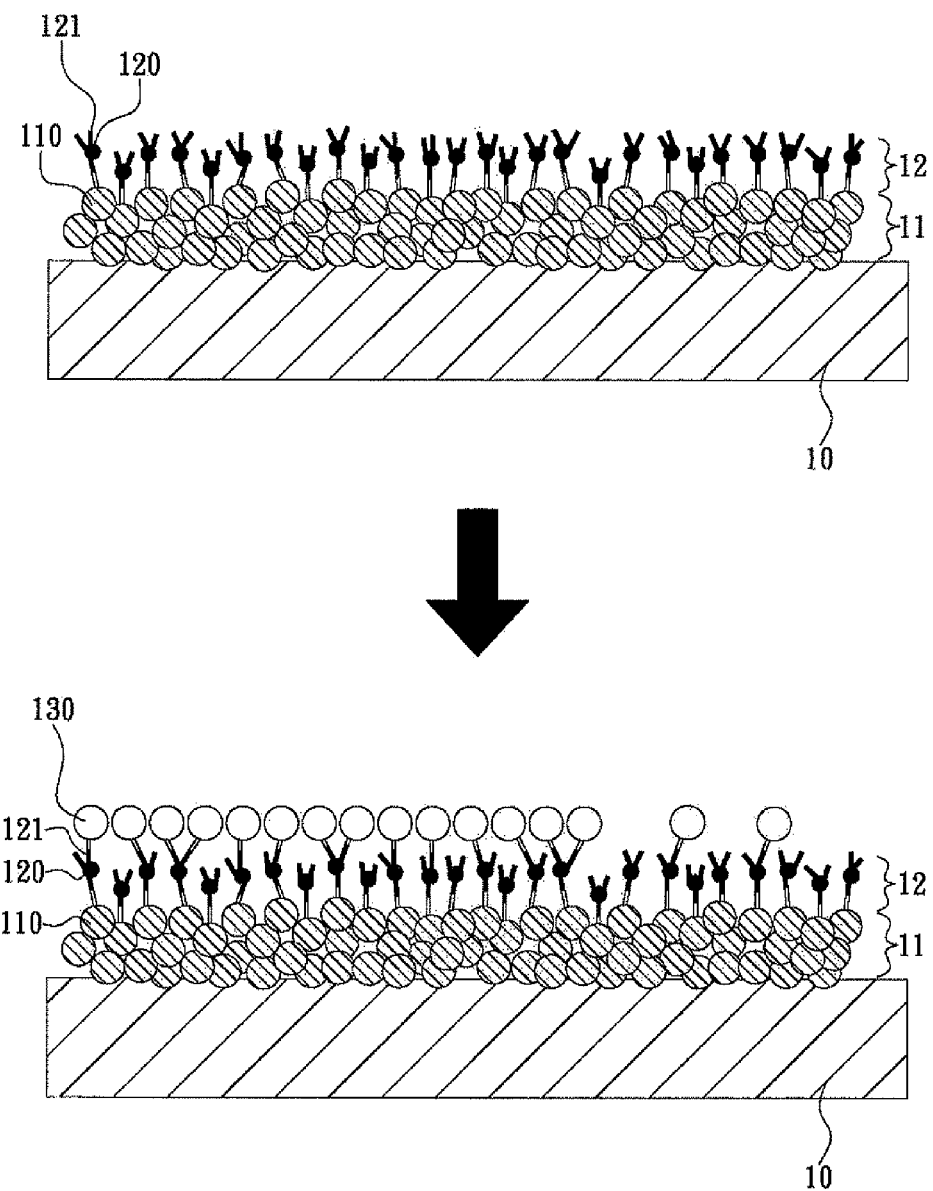
FIG. 4 is the fourth schematic drawing of the preferred embodiment of the present invention.

Referring to FIG. 4, upon completion of the foregoing step, chemical vapor deposition is carried out by, as in this embodiment, introducing a titanium compound (i.e., an organic metal compound) and ammonia (i.e., a reactant gas). The titanium ions 130 of the titanium compound are guided in the directions of the electric dipoles of the dangling bonds 121 and are uniformly bound to the dangling bonds 121. In addition, referring to FIG. 5, the nitrogen ions 131 of the ammonia ($NH_3$) are bound to the titanium ions 130 by ionic bonding. Thus, a titanium nitride epitaxial layer 13 (i.e., a compound epitaxial layer) is formed. In this preferred embodiment, tetrakis(dimethylamido)titanium (TDMAT) is used as the organic metal compound, and ammonia ($NH_3$) as the reactant gas. With TDMAT being only one example of organic metal compounds, applicable organic metal compounds are by no means limited thereto. A manufacturer may change the composition of the organic metal compound according to the manufacturing process used and product design requirements. Apart from that, phosphine ($PH_3$), water ($H_2O$), hydrogen sulfide ($H_2S$) or arsine ($AsH_3$) may also be used as the reactant gas in order to produce a compound epitaxial layer containing the element phosphorus, oxygen, sulfur or arsenic. All changes in materials readily conceivable by a person skilled in the art should fall within the scope of the present invention.

Figure 5:
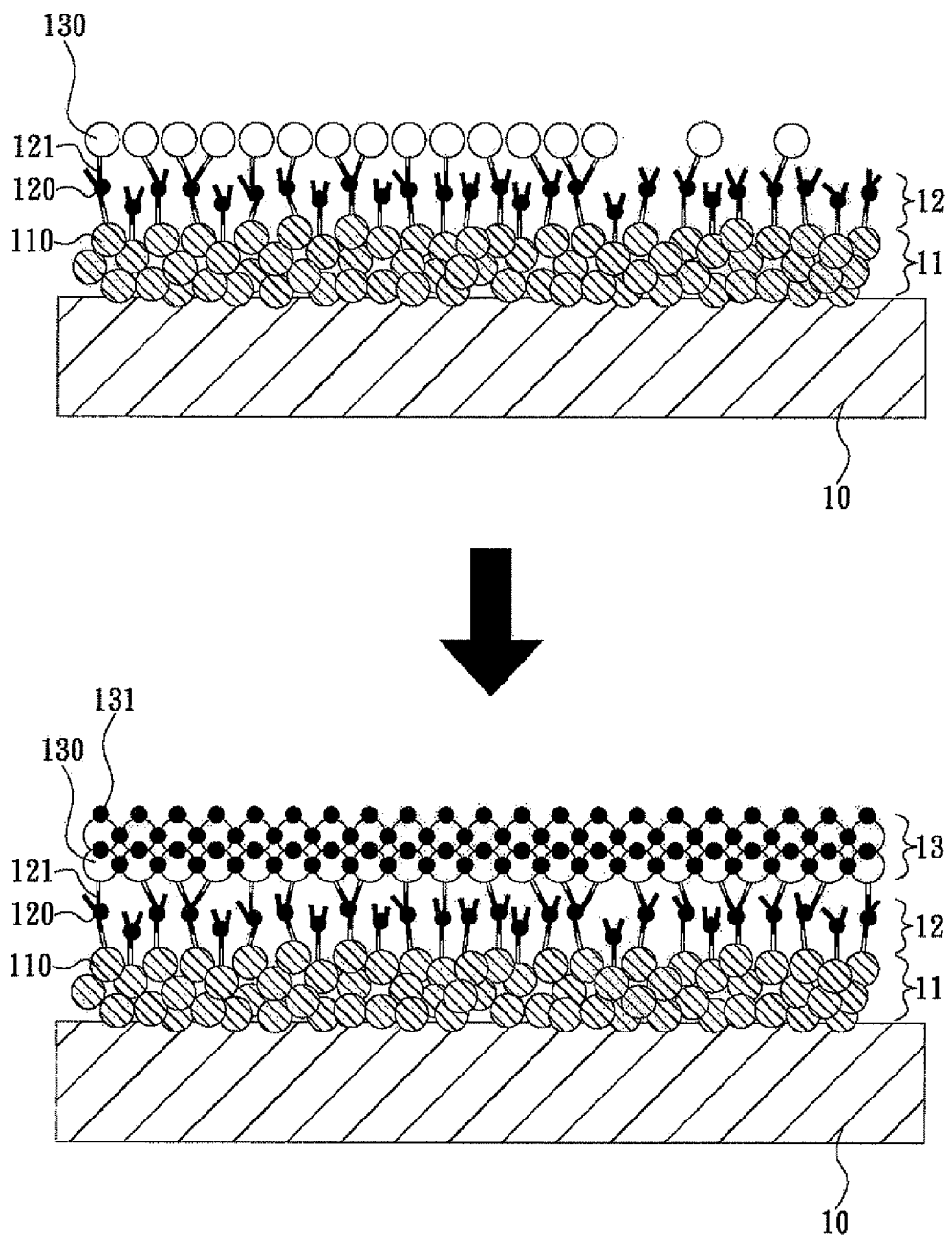
FIG. 5 is the fifth schematic drawing of the preferred embodiment of the present invention.

Referring to FIG. 5, the technical features of the present invention are such that, owing to the strong polarity of the dangling bonds 121 and the specific directions of the electric dipole attraction of the dangling bonds 121, not only are epitaxial barriers lowered, but also the titanium ions 130 of the titanium compound are guided in the correct directions to be uniformly bound to the dangling bonds 121, with a strong bonding force between the titanium ions 130 and the dangling bonds 121. Moreover, the binding between, and the arrangement of, the nitrogen ions 131 and the titanium ions 130 are rendered uniform, thanks to the electric dipoles that enable automatic adjustment of the direction of contact between the nitrogen ions 131 and the titanium ions 130. Therefore, the titanium nitride epitaxial layer 13 formed according to the present invention has high quality, high hardness and excellent spectrum absorption features. Further, as the titanium nitride epitaxial layer 13, the unsaturated ionic bond layer 12 and the contact layer 11 are bound together by chemical bonding, with a bond strength far greater than the binding strength conventionally achieved by physical contact, delamination of the different layers is effectively prevented. Not only that, since the present invention does not need the complicated buffer structure conventionally required, the reduced complexity of the manufacturing process lowers production costs while the reduced use of chemicals contributes to environmental protection.

Using KLA-Tencor's testing machine RS75, the inventor conducted a four-point probe test on a product made by the method of the preferred embodiment, and the product under test could not be pierced. Given that the probe is made of tungsten carbide, whose Mohs hardness ranges from 8.5 to 9.0, the epitaxy product of the present invention possesses the characteristic of a superhard material. Also, a thickness test was performed with THERMA WAVE's measuring machine OP2600 in the DUV (deep ultraviolet) mode, and yet the correct thickness could not be obtained. This means that the reflectivity of the product is less than 13% and that the product is highly absorptive in the DUV range. An additional SEM (scanning electron microscope) thickness check shows that the thickness of the titanium nitride epitaxial layer 13 is 30±0.1 nm, wherein the thickness uniformity (0.1÷30) is less than 0.35% and complies with the thickness uniformity requirement for epitaxy, i.e., less than 1.0%.

To sum up, with the electric dipole attraction of the dangling bonds 121 serving to guide and arrange the titanium ions 130 (i.e., the metal ions) and the nitrogen ions 131 (i.e., the anions of the reactant gas) in the correct directions during the formation of the titanium nitride epitaxial layer 13 (i.e., the compound epitaxial layer), mirror-like planar crystals can be successfully formed without island-type nucleation or cluster growth, which are two structural characteristics of columnar crystals. A manufacturer can therefore produce mirror-like planar crystals without using the expensive MBE manufacturing process, and product yield can be significantly increased while production costs are lowered.

While the invention herein disclosed has been described by means of specific embodiments, numerous modifications and variations could be made thereto by those skilled in the art without departing from the scope of the invention set forth in the claims.

What is claimed is:

1. An epitaxial product having a compound epitaxial layer formed by chemical bonding, the epitaxial product comprising:
    a substrate;
    a contact layer formed on a surface of the substrate;
    an unsaturated ionic bond layer formed on a surface of the contact layer away from the substrate, wherein atoms on the surface of the contact layer are chemically reacted with non-metal atoms such that the non-metal atoms are turned out to be non-metal ions, the non-metal ions are bound to the atoms on the surface of the contact layer by chemical bonding for forming the unsaturated ionic bond layer and, after the non-metal ions are subjected to energy excitation, unpaired electrons of the non-metal ions that have not been bound to the atoms on the surface of the contact layer become dangling bonds; and
    a compound epitaxial layer formed on a surface of the unsaturated ionic bond layer away from the contact layer by chemical vapor deposition through introducing organic metal compounds and reactant gas to the unsaturated ionic bond layer, wherein metal ions of the organic metal compounds are guided by electric dipole attraction of the dangling bonds and then bound to the dangling bonds, and anions of the reactant gas are bound to the metal ions by ionic bonding, thereby the compound epitaxial layer is formed on the surface of the unsaturated ionic bond layer by chemical bonding.

2. The epitaxial product of claim 1, wherein the contact layer is a metal layer made of titanium, tantalum, aluminum, zinc, scandium, zirconium or magnesium.

3. The epitaxial product of claim 1, wherein the contact layer is an amphoteric-element layer made of boron or silicon.

4. The epitaxial product of claim 2, wherein the non-metal atoms chemically reacting with the atoms on the surface of the contact layer are nitrogen, phosphorus, oxygen or sulfur atoms.

5. The epitaxial product of claim 3, wherein the non-metal atoms chemically reacting with the atoms on the surface of the contact layer are nitrogen, phosphorus, oxygen or sulfur atoms.

6. The epitaxial product of claim 4, wherein the reactant gas is ammonia, phosphine, water, hydrogen sulfide or arsine such that the compound epitaxial layer contains the element nitrogen, phosphorus, oxygen, sulfur or arsenic.

7. The epitaxial product of claim 5, wherein the reactant gas is ammonia, phosphine, water, hydrogen sulfide or arsine such that the compound epitaxial layer contains the element nitrogen, phosphorus, oxygen, sulfur or arsenic.

8. The epitaxial product of claim 6, wherein the organic metal compound is tetrakis(dimethylamido)titanium.

9. The epitaxial product of claim 7, wherein the organic metal compound is tetrakis(dimethylamido)titanium.

10. The cpitaxy epitaxial product of claim 8, wherein the substrate is a silicon wafer or is made of fused quartz, copper-molybdenum alloy, tungsten or titanium.

11. The epitaxial product of claim 9, wherein the substrate is a silicon wafer or is made of fused quartz, copper-molybdenum alloy, tungsten or titanium.

* * * * *